(12) United States Patent
Maeda

(10) Patent No.: US 6,207,979 B1
(45) Date of Patent: Mar. 27, 2001

(54) GATE ARRAY AND MANUFACTURING METHOD OF SEMICONDUCTOR INTEGRATED CIRCUIT USING GATE ARRAY

(75) Inventor: Shigenobu Maeda, Tokyko (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/044,927

(22) Filed: Mar. 20, 1998

(30) Foreign Application Priority Data

Oct. 17, 1997 (JP) .................................................. 9-285132

(51) Int. Cl.$^7$ .................................................. H01L 27/10
(52) U.S. Cl. ........................................... 257/202; 257/206
(58) Field of Search ...................................... 257/202, 206

(56) References Cited

U.S. PATENT DOCUMENTS 5,136,356 * 8/1992 Sakuda et al. ......................... 357/45
5,838,040 * 11/1998 Salter, III et al. ...................... 257/321

FOREIGN PATENT DOCUMENTS 63-226055  9/1988  (JP) .
3-72555    3/1991  (JP) .

* cited by examiner

Primary Examiner—Charles Bowers
Assistant Examiner—Hsien-Ming Lee
(74) Attorney, Agent, or Firm—Oblon, Spivak, McClelland, Maier & Neustadt, P.C.

(57) ABSTRACT

In a gate array, a gate length is measured by dividing gate electrodes into groups according to their materials to distinguish between those groups. The shape of a contact pad portion (5) of a gate electrode (4) differs according to the groups. A difference described here appears as shape such as cutouts (6a–6c) or projections (6d–6f), which is distinguishable by a scanning electron microscope, for example.

20 Claims, 11 Drawing Sheets

GATE ARRAY AND MANUFACTURING METHOD OF SEMICONDUCTOR INTEGRATED CIRCUIT USING GATE ARRAY

BACKGROUND OF THE INVENTION

1. Field of the Invention

The present invention is related to a gate array and a manufacturing method of a semiconductor integrated circuit using the gate array, and especially to a gate array including a row composed of gate electrodes each having a different etching rate and a manufacturing method of a semiconductor integrated circuit using the gate array.

2. Background of the Invention

In a conventional gate array, since gate electrodes of P-channel and N-channel transistors are of the same shape, at first glance, it is impossible to distinguish between a row in which the P-channel transistor is formed and a row in which the N-channel transistor is formed. For example, FIG. 11 shows a layout pattern of a structure of a gate array generally called a "sea-of-gate". A semiconductor chip is formed of various elements integrated on one semiconductor substrate. In the outskirts of the semiconductor chip 1 of FIG. 11, a pad 2 connected to a lead line for electrically connecting with the outside of the semiconductor chip 1, and an I/O buffer cell 3 for buffering, for example, a signal to be exchanged between the semiconductor chip 1 and the outside thereof, are arranged. At the central portion of the semiconductor chip 1, gate electrodes 4 are arranged in arrays. In rows C1 through C7 of the gate electrodes, the conductivity type of the transistors are allotted in order, for example, "PNNPPNN".

In a general logic device, a gate length is an important factor to determine transistor performance, so that measuring and managing a gate length during process is very important. For a conventional device, since gate electrodes of P-channel and N-channel MIS transistors are formed of the same material, there is no need to distinguish the channel type of the MIS transistors to measure the gate length.

However, when the gate electrode of the P-channel MIS transistor is formed of a P-type polysilicon and the gate electrode of the N-channel MIS transistor is formed of an N-type polysilicon, their etching rates become different from each other due to the difference of impurity. Thus, for a proper management, it becomes necessary to distinguish between the P-channel and N-channel MIS transistors to measure the respective gate lengths. FIG. 13 is a graph for explaining variations in gate length between lots of the semiconductor chip. In this figure, a closed circle indicates an average gate length of the N-channel MIS transistor; an open circle indicates an average gate length of the P-channel MIS transistor; and the straight line attached to those circles indicates a distribution range (for example, three times as large as a standard deviation). In the case of FIG. 13, the gate length is managed so as to fall in the range of ±0.05 $\mu$m centered at 0.35 $\mu$m. From this figure, it is understood that, under the same etching condition, the gate length of the P-channel MIS transistor is always longer than that of the N-channel MIS transistor. Thus, the proper management is only possible with the distinction between the N-channel and P-channel MIS transistors.

Then, it becomes necessary to measure the respective gate length by making a distinction between the gate electrodes of the P-channel and N-channel MIS transistors. When the whole semiconductor chip 1 is within the visual field as shown in FIG. 11, the conductivity type of the transistors in a region AR1, for example, can be quickly distinguished as an N-type by counting the number of rows. However, when a part of the region AR1 of the semiconductor chip 1 is enlarged by a scanning electron microscope, for example, as shown in FIG. 12, to measure the gate lengths of the N-channel and the P-channel MIS transistors, it becomes difficult to distinguish the channel type of the transistors in the region AR1.

In the above-described conventional gate array and manufacturing method of the semiconductor integrated circuit using the gate array, when the gate electrodes are formed of materials having different etching rates, the gate electrodes need to be separated into groups according to their materials to measure the gate length. However, there is no mark for distinguishing between the gate electrodes at the gate electrodes or in the vicinity of the gate electrodes in the conventional gate array. Thus, for an enlarged gate electrode, it is difficult to determine which group the gate electrode to be measured, for example, belongs to, and thereby the processing time for measurement is increased.

SUMMARY OF THE INVENTION

A first aspect of the present invention is directed to a crate array comprising: a plurality of first rows formed by arranging a plurality of first MIS transistors on a semiconductor substrate; and a plurality of second rows formed by arranging a plurality of second MIS transistors on the semiconductor substrate, wherein there is a difference in shape of a predetermined structural member, distinguishable by appearances, between the first and second rows.

Preferably, according to a second aspect of the present invention, in the gate array according to the first aspect, the predetermined structural member is a contact pad portion of a gate electrode.

Preferably, according to a third aspect of the present invention, in the gate array according to the second aspect, the contact pad portion of the gate electrode includes a protruding part; the protruding part in one row is arranged in a direction determined by a predetermined rule; and the predetermined rule for the first row is different from that for the second row.

Preferably, according to a fourth aspect of the present invention, in the gate array according to the third aspect, the protruding part in the first row is arranged in the opposite direction to that in the second row; and both center lines of the contact pad portions in the first and second rows almost agree with the same straight line.

Preferably, according to a fifth aspect of the present invention, in the gate array according to the third aspect, the protruding part in the first row is arranged in the opposite direction to that in the second row; and both center lines of portions of the gate electrodes in the first and second rows, except the contact pad portions, almost agree with the same straight line.

Preferably, according to a sixth aspect of the present invention, in the gate array according to the third aspect, the predetermined rule provides a plurality of arrangements each corresponding to different information.

Preferably, according to a seventh aspect of the present invention, in the gate array according to the first aspect, the predetermined structural member is a field oxide film.

Preferably, according to an eighth aspect of the present invention, in the gate array according to the first aspect, the predetermined structural member is a field shield electrode.

Preferably, according to a ninth aspect of the present invention, in the gate array according to the eighth aspect, there is a difference in the shape of a hole for body contact provided in the field shield electrode, between the first and second rows.

A tenth aspect of the present invention is directed to a manufacturing method of a semiconductor integrated circuit using a gate array, comprising the steps of: forming a plurality of first rows by arranging a plurality of first MIS transistors on a semiconductor substrate, and a plurality of second rows by arranging a plurality of second MIS transistors each having a gate electrode which is different from that of the first MIS transistor in an etching rate of a material, the second row including a difference in shape, distinguishable by the appearance of the semiconductor substrate, from the first row; and measuring a gate length by distinguishing between the first and second rows on the basis of the difference in shape while enlarging a gate electrode.

In the gate array of the first aspect or the manufacturing method of the semiconductor integrated circuit using the gate array of the tenth aspect, when the gate length is measured, for example, the gate electrodes formed of materials having different etching rates can be distinguished by the difference in shape between the first and second rows. This prevents misjudgment of the material of the gate electrode to be measured, and further shortens time to confirm the material of the gate electrode.

In the gate array of the second aspect, the first and second rows are distinguishable by the shape of the contact pad portion of the gate electrode, that is, only by the gate electrode. This brings about quick measurement.

In the gate array of the third aspect, the difference in shape is easily distinguishable because the protruding part whose direction is examined is relatively large in shape.

In the gate array of the fourth aspect, the source/drain contacts in the first and second rows can be positioned in the same straight line. Thus, the design for the position of the source/drain contact remains the same as before, which reduces the complexity of design.

In the gate array of the fifth aspect, the design for the position of the contact arranged in the contact pad portion of the gate electrode remains the same as before, which reduces the complexity of design.

In the gate array of the sixth aspect, it is possible to transmit information necessary for measurement except that for distinguishing between the first and second rows, depending on the combination of arrangements. This reduces the movement of the visual field when the gate electrode is enlarged, resulting in quick measurement when such transmission of information is required.

In the gate array of the seventh aspect, the first and second rows can be distinguished by observing the field oxide film in the vicinity of the gate electrode, which brings about quick measurement. Further, since the design of the gate array remains the same as before except for the shape of the field oxide film, the complexity of design can be suppressed.

In the gate array of the eight aspect, the first and second rows can be distinguished by observing the field electrode in the vicinity of the gate electrode, which brings about quick measurement. Further, since the design of the gate array such as the shape of the gate electrode remains the same as before except for the shape of the field oxide film, the complexity of design can be suppressed.

In the gate array of the ninth aspect, the first and second rows can be distinguished by observing the hole for body contact, in large numbers for each row, formed in the vicinity of the gate electrode, which brings about quick measurement. Further, since the design of the gate array remains the same as before except for the shape of the hole for body contact, the complexity of design can be suppressed.

The object of the present invention is to simplify the distinction between groups of enlarged gate electrodes by adding information of the grouping at the gate electrode or in the vicinity of the gate electrode, and thereby to shorten the processing time to recognize the gate electrode with the scanning electron microscope.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 11:
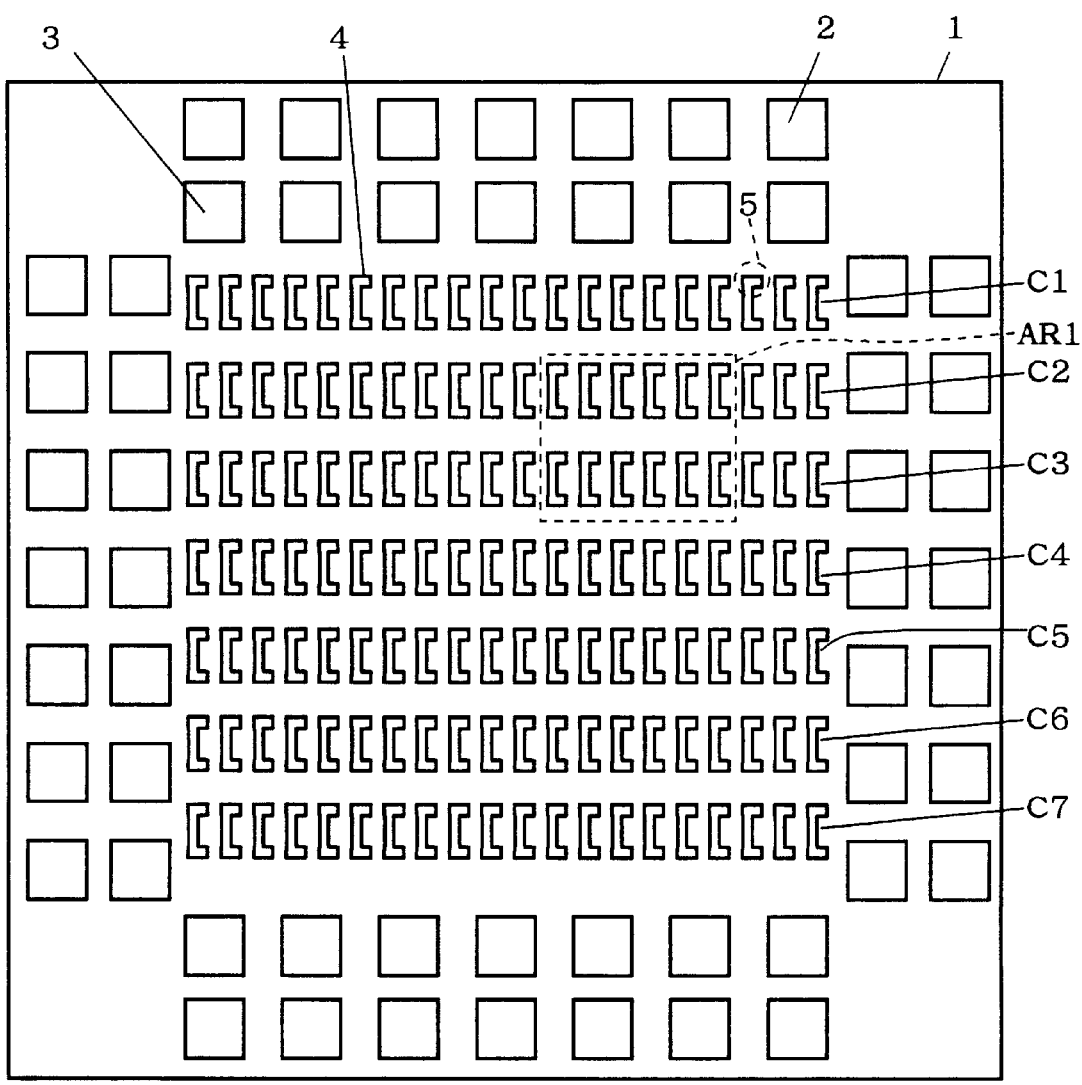
FIG. 11 is a layout showing a structure of a semiconductor chip with the gate array formed thereon.
Figure 12:
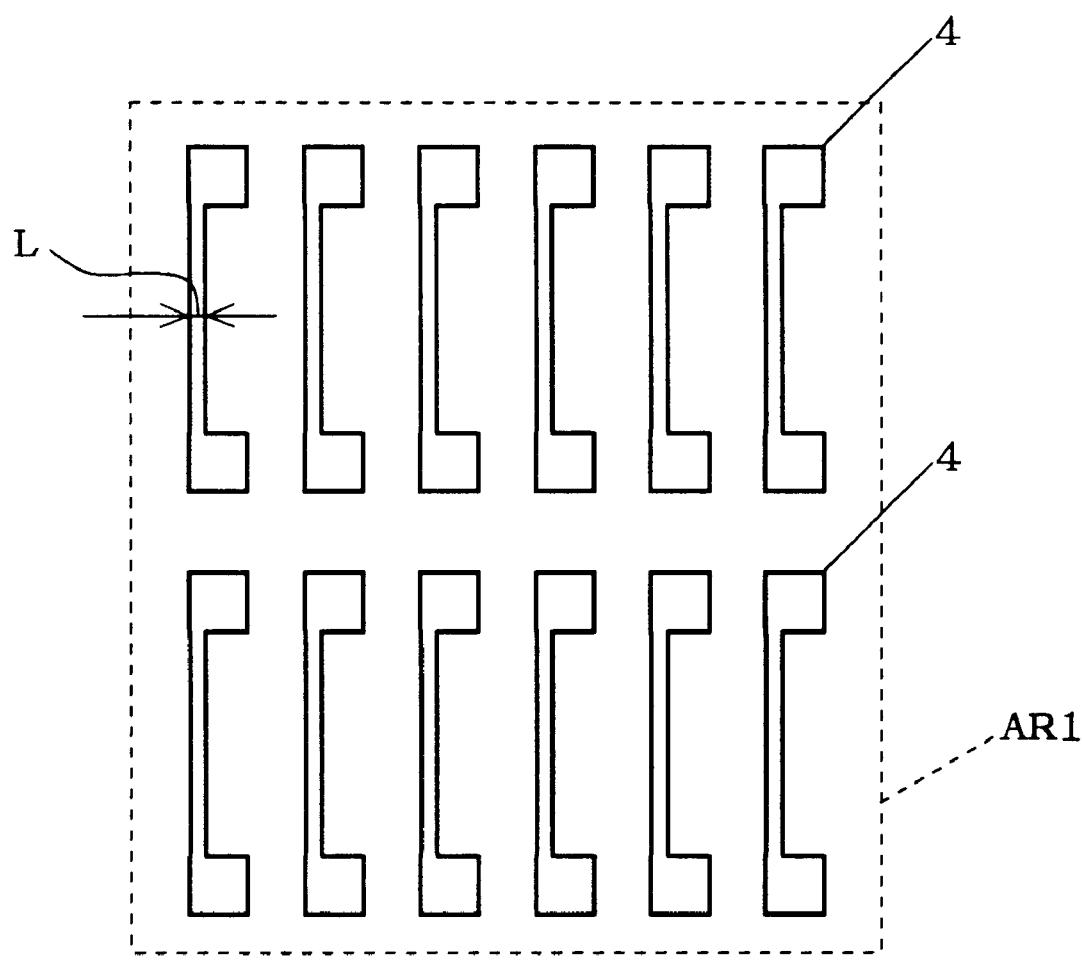
FIG. 12 is a partly enlarged plan view of FIG. 11.
Figure 13:
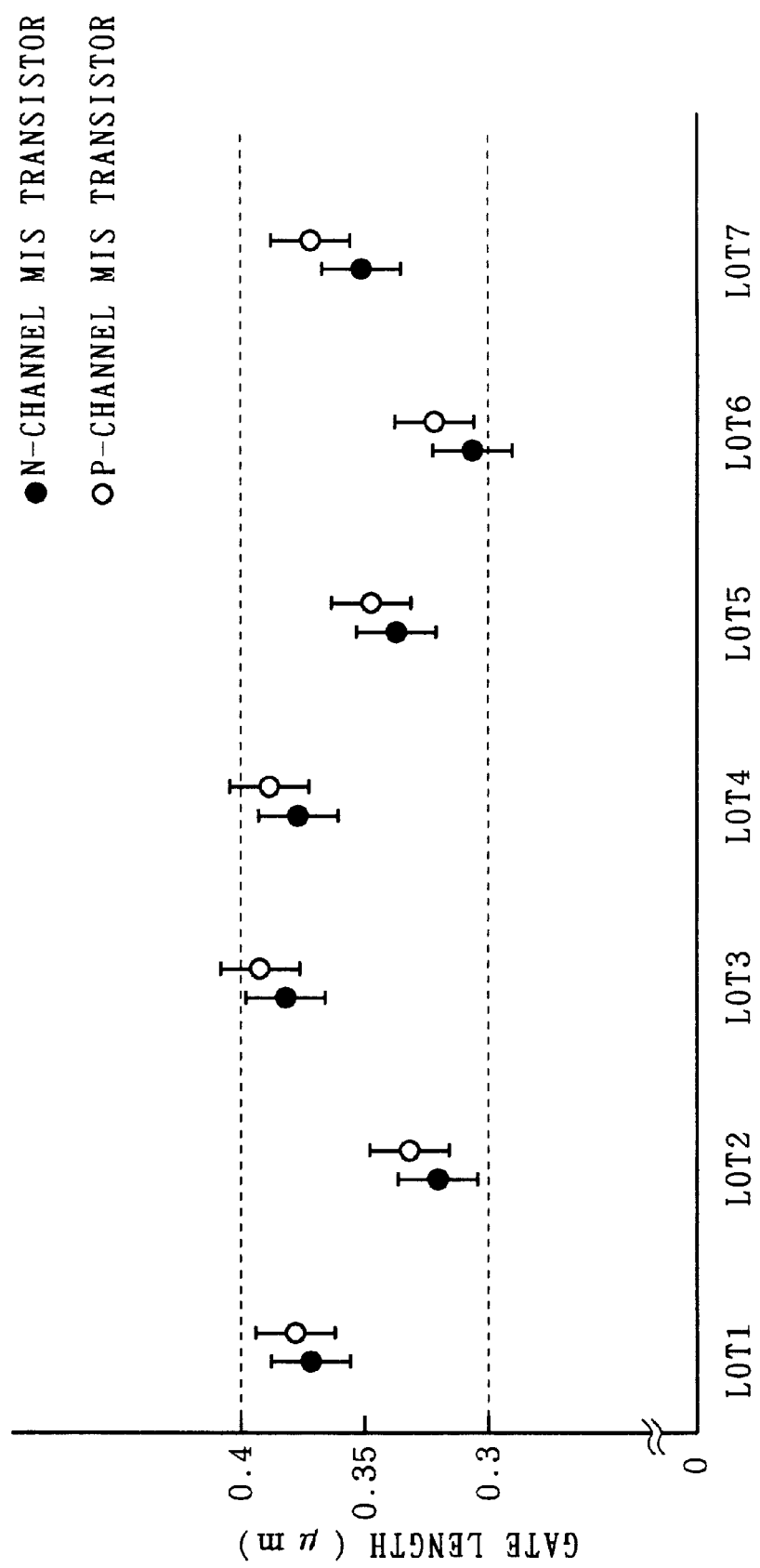
FIG. 13 is a graph for explaining variations in gate length between lots of the semiconductor chip.

With reference to FIGS. 1A to 1F, a gate arrays according to a first preferred embodiment will be described. The important point of the invention as to a structure of the gate array according to the first preferred embodiment is that the shape of a contact pad portion differs depending on groups so as to add information of classification into groups. Different gate electrodes which are made from materials having different etching rates belong to different groups, respectively. The different groups are classified according to the shapes of the contact pad portions. In FIG. 11, for example, rows C1, C4 and C5 are composed of P-channel MIS transistors; and rows C2, C3, C6 and C7 are composed of N-channel MIS transistors. Each row belonging to a group of C1, C4 and C5 is called a row C1; and each row belonging to a group of C2, C3, C6 and C7 is called a row CC2. The rows CC1 and CC2 comprise gate electrodes formed of a P-type polysilicon and an N-type polysilicon, respectively. FIGS. 1A to 1F are plan views showing a variety of structures of a contact pad portion according to the first preferred embodiment. For example, either of cutouts 6a through 6c or projections 6d through 6f as shown in FIGS. 1A through 1F is formed at a contact pad portion 5 of each gate electrode in the row CC1, while no cutout or projection is formed at a contact pad portion 5 of each gate electrode in the row CC2. The contact pad portion 5 is a wide portion provided at both ends of a gate electrode 4. With such a difference in the shape of the contact pad portion 5 between the rows CC1 and CC2, it becomes possible to distinguish the channel type of a transistor, N-channel or P-channel, of a gate electrode 4 within a visual field of a scanning electron microscope even if only one gate electrode is within the field. This prevents a misjudgment of the group, such as a conductivity type, of an object of measurement, and also prevents measurement from taking a long time to confirm the conductivity type of the object of measurement. When there is a difference in the shape of the contact pad portion 5 between the rows CC1 and CC2, the movement of the visual field to distinguish the difference of the contact pad portions 5 is only limited to the range of less than one gate electrode. Thus, the processing time for measurement can be sufficiently reduced.

Further, the same effect as described above can be obtained by changing the shape of the contact pad portions 5 only off some gate electrodes 4 in the row CC1, for example, every other one or two gate electrodes.

Moreover, even if the contact pad portions 5 of both transistors are altered in shape, the same effect can be obtained as long as the P-channel MIS transistor differs from the N-channel MIS transistor in shape.

Further, the present invention does not limit the shape of the contact pad portion 5 required to obtain the effect of the first preferred embodiment. The contact pad portion 5 need not be of the same shapes shown in FIGS. 1A through 1F. As long as it can be distinguished by shape from the other when observed bay it the scanning electron microscope, the same effect as described above can be obtained.

Figure 1A:
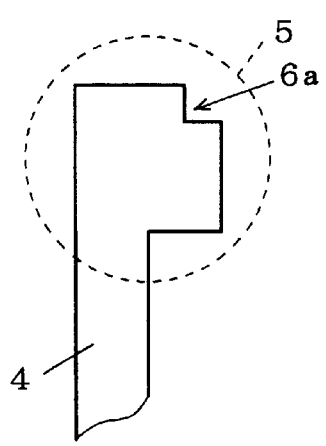
FIGS. 1A to 1F are plan views showing various structures of a contact pad portion in accordance with a first preferred embodiment of the present invention.
Figure 1B:
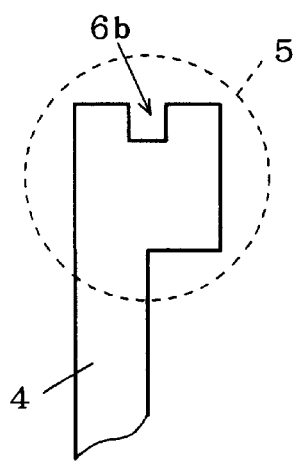
Figure 1C:
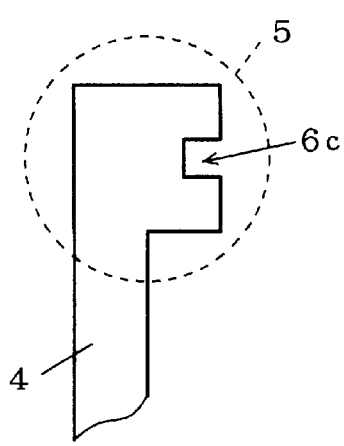
Figure 1D:
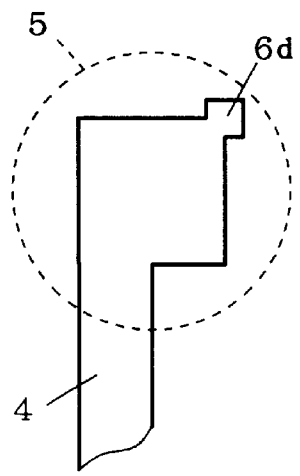
Figure 1E:
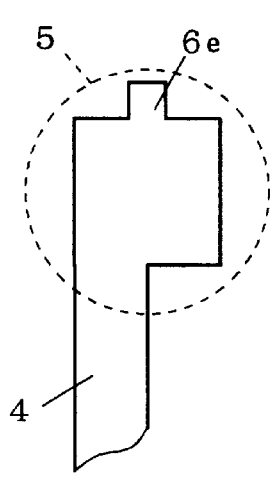
Figure 1F:
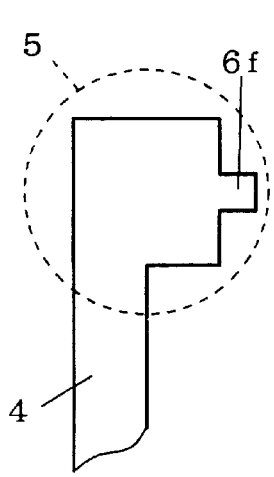

Furthermore, one row, for example the row CC1, may include the contact pad portions 5 in a plurality of shapes, for example, alternately in the shapes of FIGS. 1A and 1B. This makes it possible to transmit other information such as the number of rows or a specific row requiring measurement, and further, reducing the movement of the visual field, for example of the scanning electron microscope, to confirm such specific information brings about quick measurement. Further, in this case, more portions can be measured during the same measuring time as before, which improves yield, for example.

2. Second Preferred Embodiment

In the gate array according to the first preferred embodiment, either of the cutouts 6a through 6c or the projections 6d through 6f is formed to change the shape of the contact pad portion 5. On the other hand, in the gate array according to a second preferred embodiment, the direction of a protruding part of the contact pad portion 5 differs depending on groups to distinguish the groups.

Figure 2:
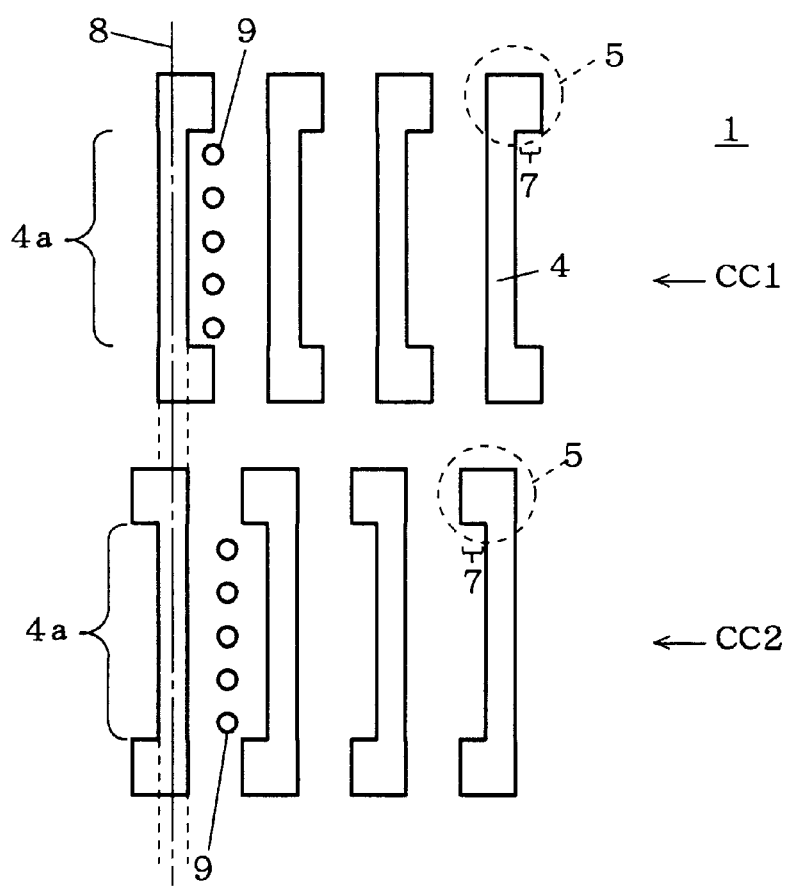
FIG. 2 is a plan view showing a structure of a gate array in accordance with a second preferred embodiment of the present invention.

FIG. 2 is a plan view showing a structure of the gate array according to the second preferred embodiment. As shown in FIG. 2, protruding parts 7 of all gate electrodes 4 in the row CC1 are arranged in the right direction, while those in the row CC2 are arranged in the left direction. Thus, even if only one gate electrode 4 is within the visual field of the scanning electron microscope, it is possible to distinguish between the N-channel and P-channel MIS transistors by the direction of the protruding part 7. Further, even if only a part of the gate electrode 4 is within the visual field, only slight movement of the visual field is enough to bring the contact pad portion 5 within the field. Thus, the processing time for measurement is sufficiently reduced.

In FIG. 2, the dashed-and-dotted line with the reference numeral 8 is the center line passing through a channel region of the gate electrode 4. As shown in FIG. 2, portions 4a of the gate electrodes 4, except the contact pad portion 5, in both rows CC1 and CC2 in the same column are arranged so that their center lines agree with the dashed-and-dotted line 8. That is, the center line passing through the portion 4a of the gate electrode 4, except the contact pad portion 5, in the row CC1 agrees with the center line passing through the portion 4a of the gate electrode 4, except the contact pad portion 5, in the row CC2. Thus, a Source/drain contact 9 can be arranged in the same position as before. That is, the design of the source/drain contact 9 remains the same as before, which reduces the complexity of design to be caused by the application of the present invention.

Figure 3A:
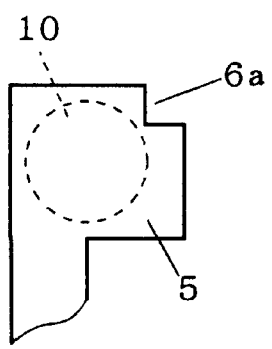
FIGS. 3A and 3B are diagrams for explaining arrangements of a contact in the contact pad portion.
Figure 3B:
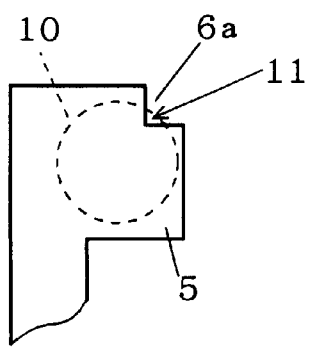

FIGS. 3A and 3B show examples of a contact 10 arranged in the contact pad portion 5 having the cutout 6a; FIG. 3A shows a normal case; and FIG. 3B shows an abnormal case. A region 11 of FIG. 3B indicates a portion of the contact stacked out from the contact pad portion 5. In such a case, the contact connects with other diffusion regions, and thereby an inferior device is produced. Thus, yield is likely to be reduced. On the other hand, in the structure with no cutout according to the second preferred embodiment, the reduction of yield due to such causes can be prevented.

Figure 4:
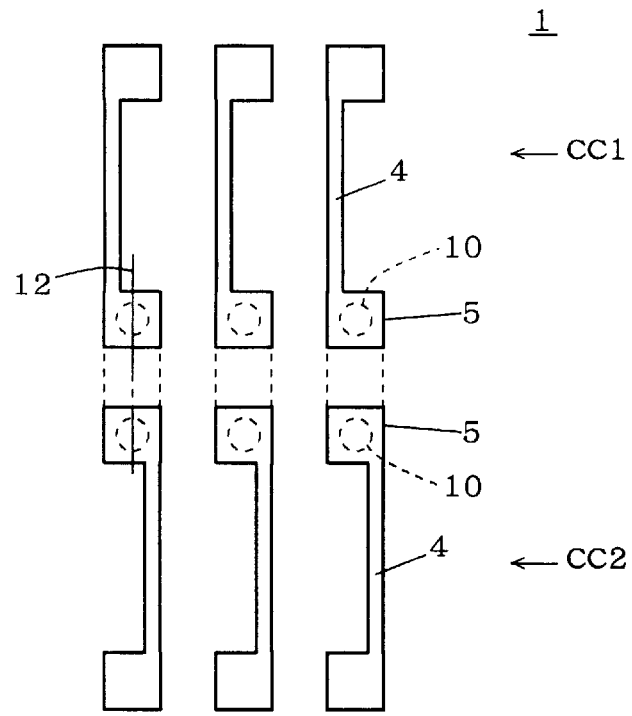
FIG. 4 is a plan view showing another structure of the gate array in accordance with the second preferred embodiment of the present invention.

Further, as shown in FIG. 4, the positions of the contact pad portions 5 in the rows CC1 and CC2 of different groups may be arranged in order along columns. In other words, the center lines of the contact pad portions 5 of the different lines CC1 and CC2 agree with each other. With Such an arrangement, the contact 10 is formed in the same position as the contact pad portion 5. That is, the design of the gate contact remains the same as before, which reduces the complexity of design to be caused bay the application of the present invention.

The election of the structures shown in FIG. 2 or FIG. 4 is made by the numbers of gate contacts and source/drain contacts.

3. Third Preferred Embodiment

In the gate array according to the second preferred embodiment, the protruding parts 7 of all contact pad portions 5 in one row are arranged in the same direction. On the other hand, in the gate array according to a third preferred embodiment, one row includes the protruding parts 7 arranged in different directions.

Figure 5:
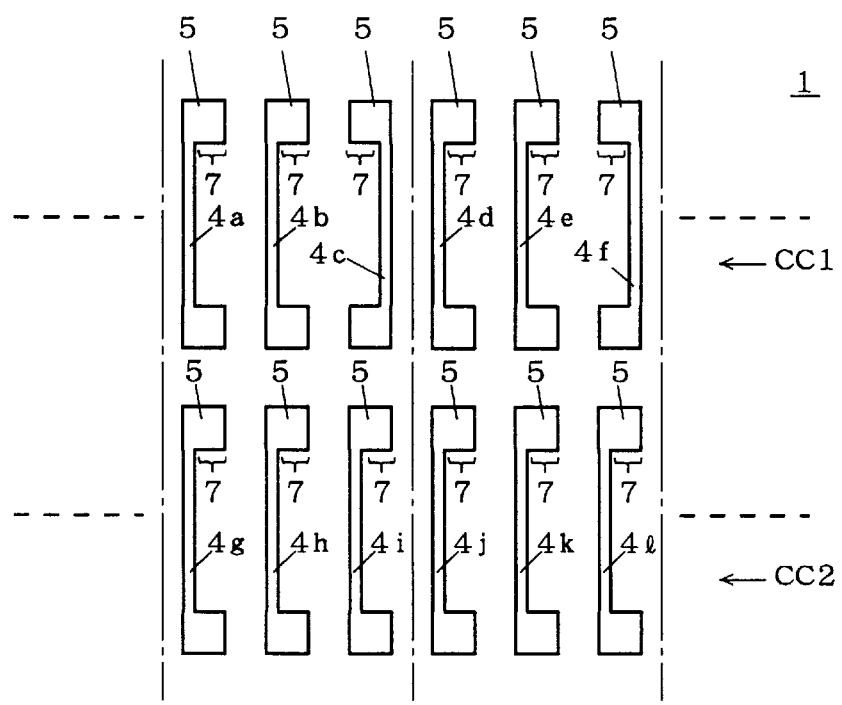
FIG. 5 is a plan view showing an array of the gate electrodes of the gate array in accordance with a third preferred embodiment of the present invention.

FIG. 5 is a plan view showing an arrangement of gate electrodes in the gate array according to the third preferred embodiment. As shown in FIG. 5, the row CC1 includes gate electrodes 4a, 4b, 4d and 4e whose protruding parts 7 of the contact pad portions 5 are arranged in the right direction; and gate electrodes 4c and 4f whose protruding parts 7 of the contact pad portions 5 are arranged in the left direction. On the other hand, the row CC2 includes gate electrodes 4g through 4l whose protruding parts 7 are arranged in the right direction. If the rows CC1 and CC2 with such an arrangement correspond to the P-channel and N-channel MIS transistors, respectively, it is possible to determine the channel type of the MIS transistors of the gate electrode to be measured even in observation of the partly enlarged gate array. In the case of FIG. 5, for example, whether the row belongs to a P-type group or N-type can be determined by observing the directions of the contact pad portions 5 of the gate electrodes at most in an adjacent three columns.

In the structure of the gate array according to the third preferred embodiment, the gate contact and the source/drain contact cannot be formed in the same position as before in both P-channel and N-channel MIS transistors, which complicates the design compared to the structure of the second preferred embodiment a little. However, depending on a rule of arrangements, it is possible to include other information except the information for determining the channel type of the MIS transistors forming the row.

For example, taking three columns as a set, the directions "right, left, and left" of the protruding parts 7 is regarded ais "0" and the directions "right, right and left" is regarded as "1". In this case, the determination of "0" or "1" is made by the direction of the gate electrode sandwitched between the gate electrode having the protruding part 7 arranged in the right direction and the gate electrode having the protruding part 7 arranged in the left direction. Further, the end of one set is determined by the gate electrodes at the left end arranged in the right direction and the gate electrode at the right end arranged in the left direction. Such division makes it possible to transmit other information, such as the number of rows or a specific row requiring measurement, as the necessary information for inspection, and further brings about quick measurement. Further, in this case, more portions can be measured during the same measuring time as before, which improves yield, for example.

4. Fourth Preferred Embodiment

In the first through third preferred embodiments, the shape of the gate electrodes differs according to rows of different groups. However, a change may be made in the shape of other components in the row except the gate electrode. In the gate array according to a fourth preferred embodiment, the shape of a layer formed below the gate electrode the shape of a field oxide film in this case) is altered.

Figure 6:
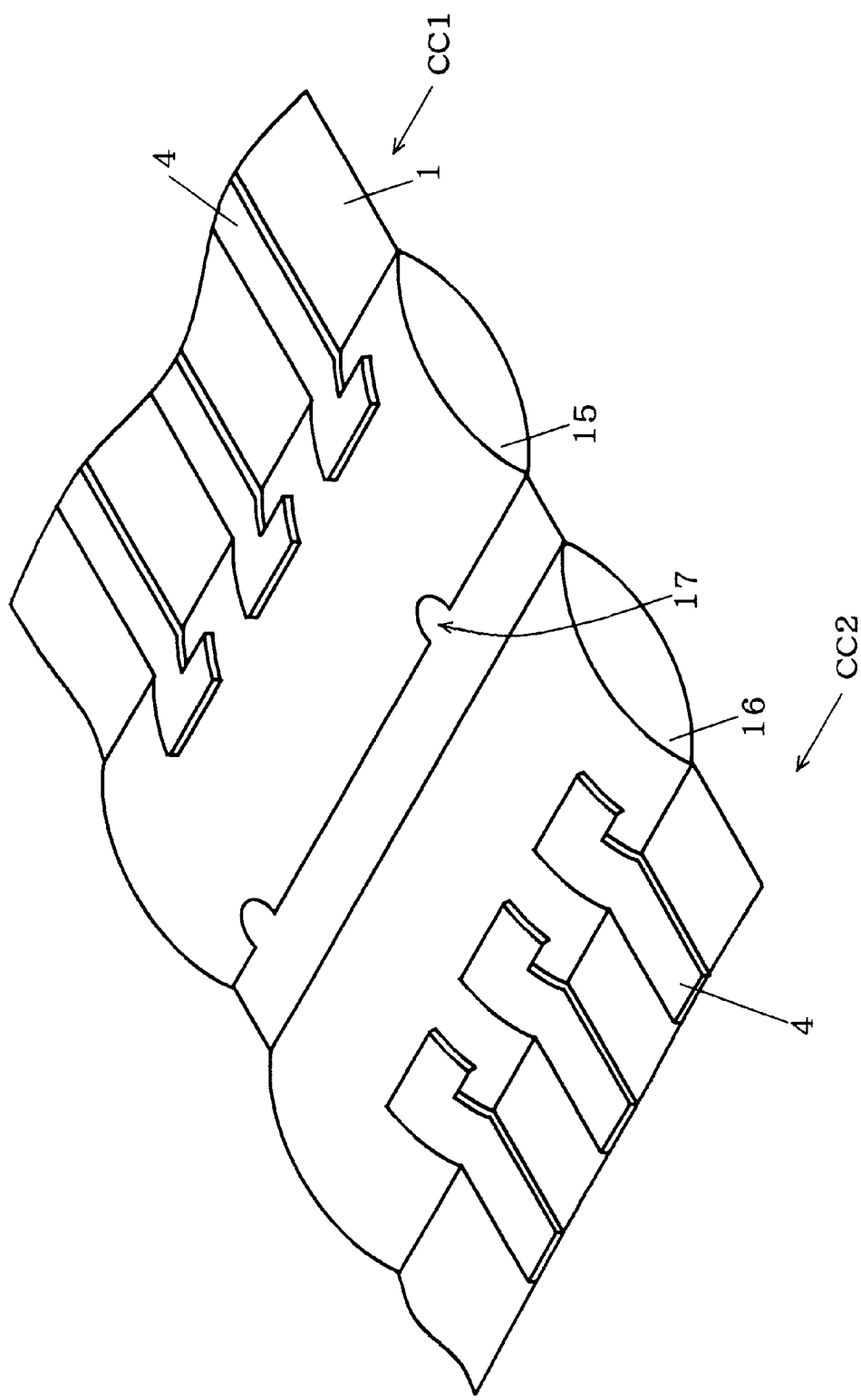
FIG. 6 is a perspective view for explaining a structure of the gate array in accordance with a fourth preferred embodiment of the present invention.

FIG. 6 is a perspective view for explaining a structure of the gate array according to the fourth preferred embodiment. In the gate array shown in FIG. 6, a row in which N-channel MIS transistors are formed and a row in which P-channel MIS transistors are formed are isolated by LOCOS isolation. Field oxide films 15 and 16 to be used in this LOCOS isolation are formed below the gate electrode 4. A change in the shape of these field oxide films 15 and 16 according to their groups provides the information that the conductivity type of the transistors formed in the row CC1 differs from that of the transistors formed in the row CC2. To be concrete, a recess 17 is formed at an edge portion on the opposite side to the gate electrode 4. In the case of FIG. 6, one recess 17 is provided every two gate electrodes 4. However, the present invention does not limit the number of the recesses 17, so that, even with a larger or smaller number of recesses, the same effect can be obtained as in the fourth preferred embodiment. Further, though employed to make a difference in shape between the field oxide films 15 and 16, the recess 17 may be substituted by a protruding part or others as long as the difference in shape can be distinguished by appearances. In such a case, the same effect can be obtained as in the fourth preferred embodiment.

Since the shape of the gate electrode 4 remains unchanged by changing the shapes of the field oxide films 15 and 16, there is no need to change the conventional design specification, which prevents the complexity of the manufacturing process.

5. Fifth Preferred Embodiment

Figure 7:
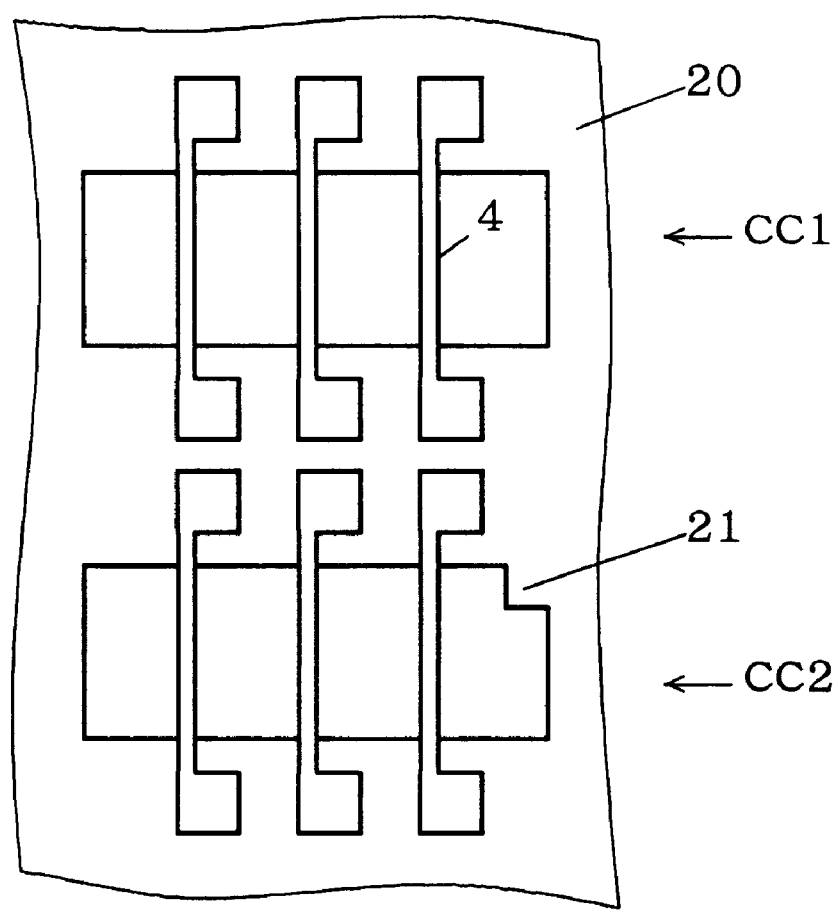
FIG. 7 is a plan view showing a structure of the gate array in accordance with a fifth preferred embodiment of the present invention.

The gate array of the sea-of-gate type is described in the fourth preferred embodiment. On the other hand, the fifth preferred embodiment is directed to a gate array in which one row is divided into several fields. FIG. 7 is a plan view showing a structure of the gate array according to the fifth preferred embodiment. Shown in this figure are the fields in the rows CC1 and CC2, respectively, with the other fields omitted. If the P-channel and N-channel MIS transistors are deposited in the rows CC1 and CC2, respectively, for example, a mark 21 is provided on the outer periphery of the field to distinguish its conductivity type from the other. The mark 21 is formed by changing a plane feature of a mask for forming a field oxide film 20 to modify the shape of the field oxide film 20. The present invention does not limit the position of the mark 21 only to the angle of the field, as well as the number of marks.

6. Sixth Preferred Embodiment

Figure 8:
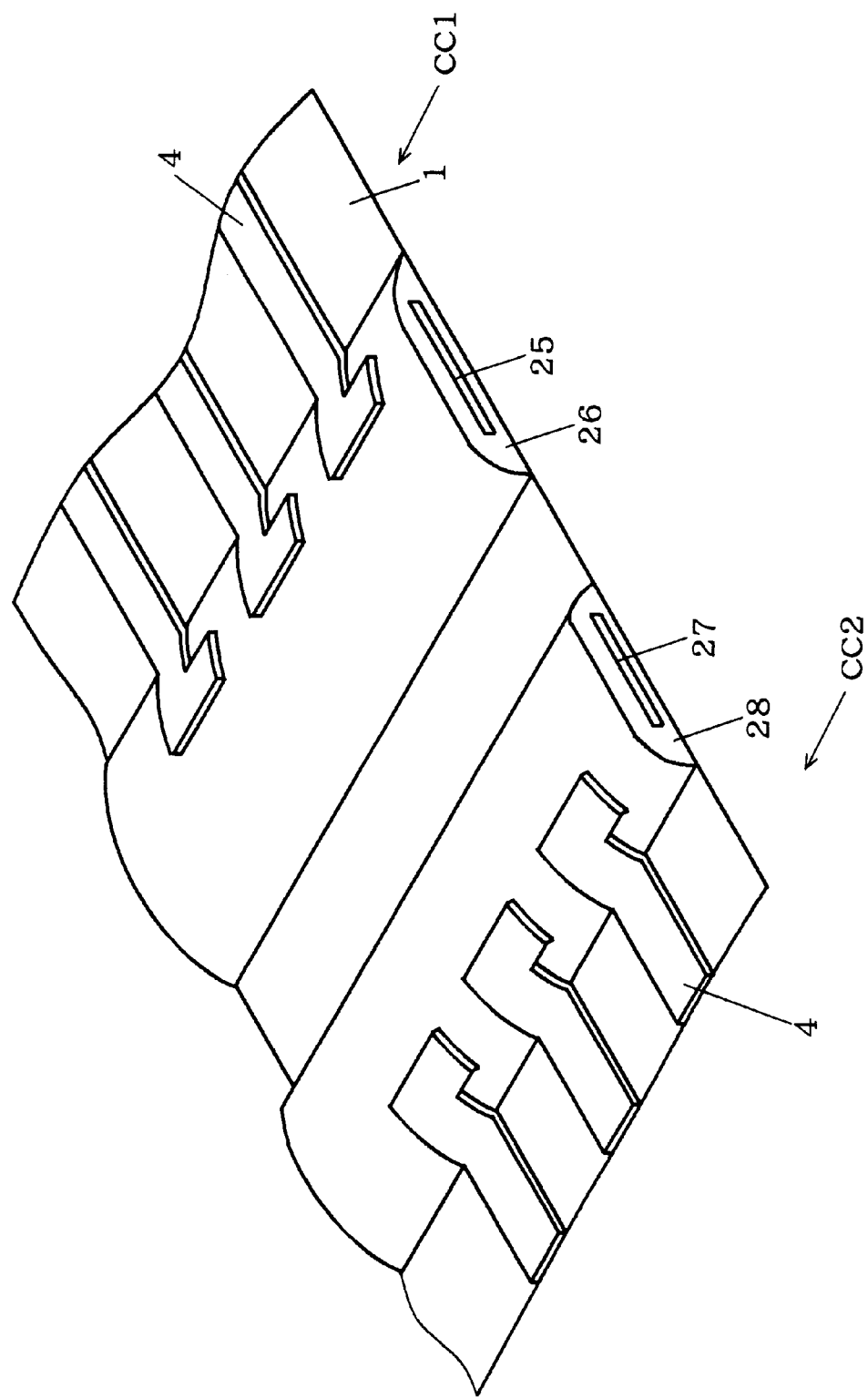
FIG. 8 is a perspective view showing a structure of the gate array in accordance with a sixth preferred embodiment of the present invention.

With reference to FIG. 8, the gate array according to a sixth preferred embodiment will be described. FIG. 8 is a perspective view for explaining a structure of the gate array according to the sixth preferred embodiment. In FIG. 8, the P-channel and N-channel MIS transistors are deposited in the rows CC1 and CC2, respectively. The gate array shown in FIG. 8 isolates transistors in different rows by field shield isolation.

In order to distinguish the conductivity types of the transistors, the widths of field shield electrodes 25 and 27 differ from each other. In the case of FIG. 8, the P-channel MIS transistor is deposited in the row CC1 having a wide field shield electrode 25; and the N-channel MIS transistor is deposited in the row CC2 having a narrow field shield electrode 27. The difference in width between the field shield electrodes 25 and 27 corresponds to the difference in width between insulating films 26 and 28 covering the field shield electrodes 25 and 27, respectively, and can be observed by the scanning electron microscope, for example.

When the field shield electrodes 25 and 27 are formed of a P-type polysilicon, an isolation breakdown voltage on the side of the P-channel MIS transistor is reduced in relation to work function. Thus, in order to increase the isolation breakdown voltage under such conditions, it is favorable to form the field shield electrode 25 wider than the field shield electrode 27. When there is some margin of the isolation breakdown voltage, the field shield electrode 27 may be formed narrower than that in the conventional case, which is effective to improve integration of the semiconductor chip 1.

On the other hand, when the field shield electrodes 25 and 27 are formed of an N-type polysilicon, an isolation breakdown voltage on the side of the N-channel MIS transistor is reduced in relation to work function. Thus, in order to increase the isolation breakdown voltage under such conditions, it is favorable to form the field shield electrode 27 wider than the field shield electrode 25. When there is some margin of the isolation breakdown voltage, the field shield electrode 25 may be formed narrower than that in the conventional case, which is effective to improve integration of the semiconductor chip 1.

7. Seventh Preferred Embodiment

Figure 9:
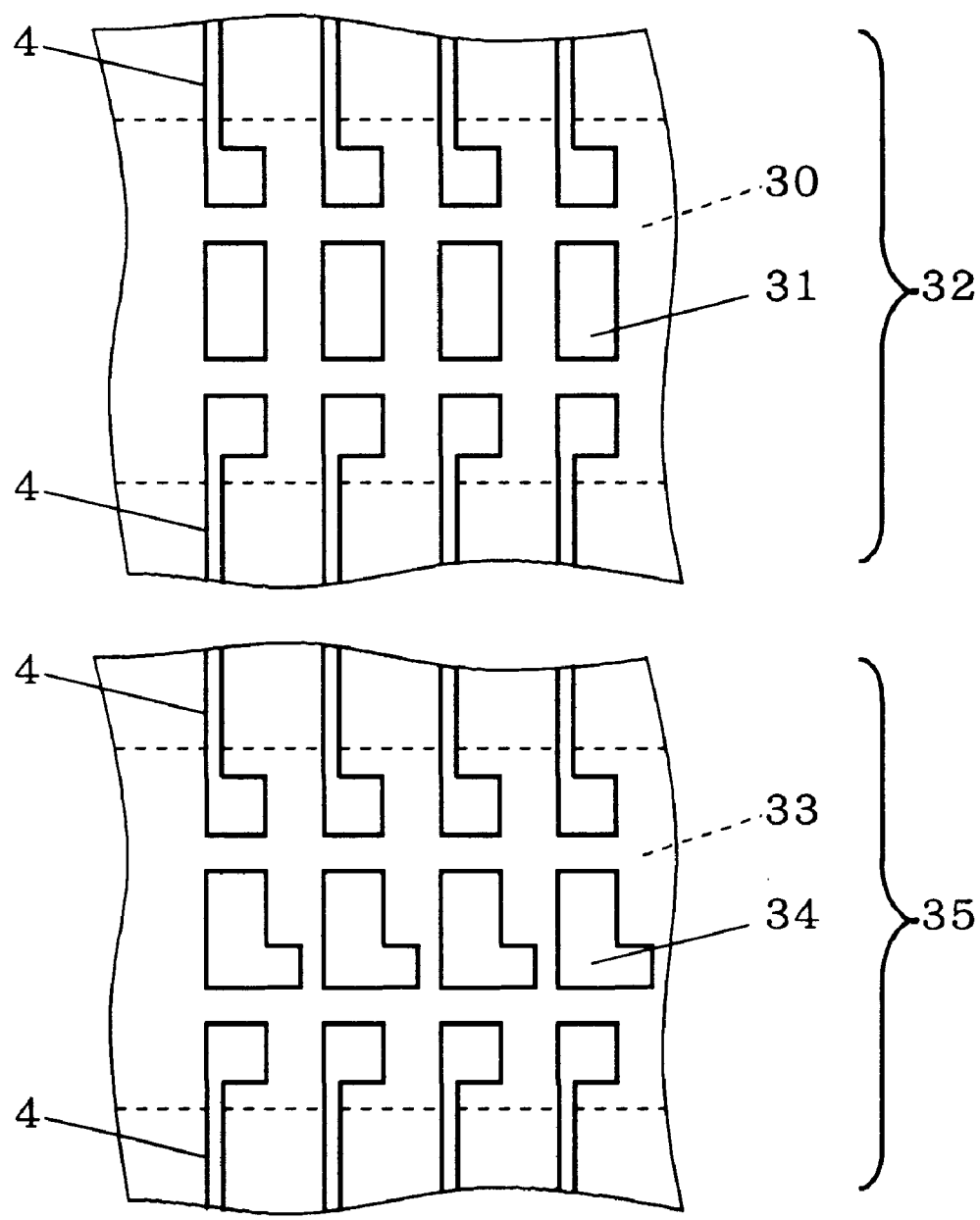
FIG. 9 is a plan view showing a structure of the gate array in accordance with a seventh preferred embodiment of the present invention.

Next, the gate array according to a seventh preferred embodiment will be described with reference to FIGS. 9 and 10. As shown in FIG. 9, a change in the shape of holes for body contact drilled in the field shield electrodes 30 and 33 provides the information for distinguishing between the P-channel and N-channel MIS transistors. In FIG. 9, for example, two rows of the gate electrodes 4, indicated by the reference numeral 32, are composed of the N-channel MIS transistors; and two rows of the gate electrodes 4, indicated by the reference numeral 35, are composed of the P-channel MIS transistors.

The shape of the hole for body contact 31 indicates that the gate electrodes 4 deposited at both ends of the hole 31 belong to the N-channel MIS transistor, while the shape of the hole for body contact 34 indicates that the gate electrodes 4 deposited at both ends of the hole 34 belong to the P-channel MIS transistor.

Even if only one gate electrode 4 is within the visual field of the scanning electron microscope, the shape of the hole for body contact 31 indicates the channel type of the MIS transistor of the gate electrode 4 within the visual field. This prevents a misjudgment of the conductivity type of an object of measurement, and further prevents measurement from taking a long time to confirm the conductivity type of the object of measurement. Further, since the shape or position of the gate electrodes 4 remains the same as before, the design of the gate electrode 4 remains the same as well.

Figure 10A:
FIGS. 10A to 10O are diagrams showing various shapes of a hole for body contact.
Figure 10B:
Figure 10C:
Figure 10D:
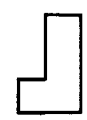
Figure 10E:
Figure 10F:
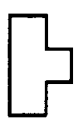
Figure 10G:
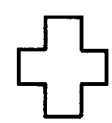
Figure 10H:
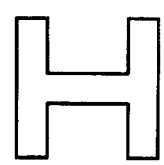
Figure 10I:
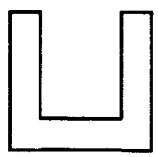
Figure 10J:
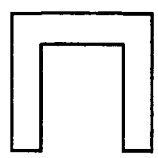
Figure 10K:
Figure 10L:
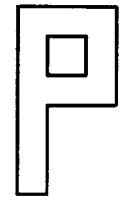
Figure 10M:
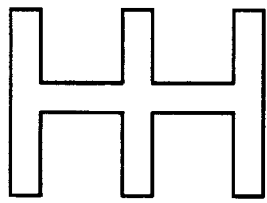
Figure 10N:
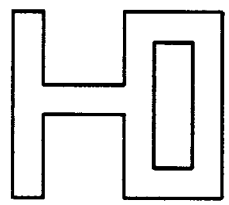
Figure 10O:
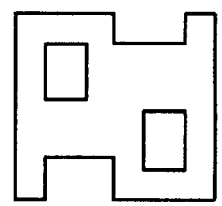

The shapes of the holes for body contact 31 and 34 may vary as shown in FIGS. 10A through 10O. Further, other information, such as the number of rows and a specific row requiring measurement can be transmitted by combining those shapes, which brings about quick measurement. Further, more portions can be measured during the same measuring time as before, so that yield can be improved.

While the invention has been described in detail, the foregoing description is in all aspects illustrative and not restrictive. It is understood that numerous other modifications and variations can be devised without departing from the scope of the invention.

I claim:

1. A gate array comprising:
a plurality of first rows formed by arranging a plurality of first MIS transistors on a semiconductor substrate; and
a plurality of second rows formed by arranging a plurality of second MIS transistors on said semiconductor substrate,
wherein there is a difference in shape of a structural member, distinguishable by appearances, between said first and second rows, wherein each of said plurality of first rows contains an identical first structure member and each of said plurality of second rows contains an identical second structural member.

2. The gate array according to claim 1, wherein said structural member is a contact pad portion of a gate electrode.

3. The gate array according to claim 2, wherein
said contact pad portion of gate electrode includes a protruding party; and
said protruding parts provide a plurality of arrangements each corresponding to different information.

4. A gate array comprising:
a plurality of first rows formed by arranging a plurality of first MIS transistors on a semiconductor substrate; and
a plurality of second rows formed by arranging a plurality of second MIS transistors on said semiconductor substrate,
wherein there is a difference in shape of a structural member, distinguishable by appearances, between said first and second rows;
wherein said structural member is a contact pad portion of a gate electrode, and
wherein said contact pad portion of said gate electrode includes a protruding part;
said protruding part in said plurality of first rows is arranged in a first direction; and
said protruding part in said second plurality of rows is arranged in a second direction different from said first direction.

5. The gate array according to claim 4, wherein
said protruding part in said plurality of first rows is arranged in the opposite direction to that in said plurality of second rows, and
both center lines of said contact pad portions in said first and second rows substantially agree with a same straight line.

6. The gate array according to claim 4, wherein
said protruding part in said plurality of first rows is arranged in the opposite direction to that in said plurality of second rows; and
both center lines of portions of said gate electrodes in said first and second rows, except said contact pad portions, substantially agree with a same straight line.

7. A gate array comprising:
a plurality of first rows formed by arranging a plurality of first MIS transistors on a semiconductor substrate; and
a plurality of second rows formed by arranging a plurality of second MIS transistors on said semiconductor substrate,
wherein there is a difference in shape of a structural member, distinguishable by appearances, between said first and second rows, and wherein
said structural member includes a field oxide film.

8. The gate array according to claim 7, wherein
said structural member further includes a field shield electrode.

9. The gate array according to claim 8, wherein
there is a difference in a shape of a hole for body contact provided in said field shield electrode, between said plurality of first and second rows.

10. A gate array comprising:
a plurality of first MIS transistors of a first conductivity type formed on a semiconductor substrate; and
a plurality of second MIS transistors of a second conductivity type formed on said semiconductor substrate,
wherein there is a difference in shape of a structural member, distinguishable by appearance, between said first and second MIS transistors, wherein each of said plurality of first MIS trasistors contain an identical first structural member and each of said plurality of second MIS transistors contains an identical second structural member.

11. The gate array according to claim 10, wherein
said structural member is a contact pad portion of a gate electrode.

12. The gate array according to claim 11, wherein
said contact pad portion of said gate electrode includes a protruding party; and
said protruding parts provide a plurality of arrangements each corresponding to different information.

13. A gate array comparing:
a plurality of first MIS transistors of a first conductivity type formed on a semiconductor substrate; and
a plurality of second MIS transistors of a second conductivity type formed on said semiconductor substrate,
wherein there is a difference in shape of a structural member, distinguishable by appearances, between said first and second MIS transistors, wherein said structural member is a contact pad portion of a gate electrode, and wherein said contact pad portion of said gate electrode includes a protruding part, said protruding part of said plurality of first MIS transistors is arranged in a first direction; and said protruding part of said second plurality of MIS transistors is arranged in a second direction different from said first direction.

14. The gate array according to claim 13, wherein said protruding part in said plurality of first MIS transistors is arranged in the opposite direction to that in said plurality of second MIS transistors; and both center lines of said contact pad portions in said first and second MIS transistors substantially agree with a same straight line.

15. The gate array according to claim 13, wherein said protruding part in said plurality of first MIS transistor is arranged in the opposite direction to that in said plurality of second MIS transistors; and both center lines of portions of said gate electrodes in said first and second MIS transistors, except said contact pad portions, substantially agree with a same straight line.

16. A gate array comprising:

a plurality of first MIS transistors of a first conductivity type formed on a semiconductor substrate; and a plurality of second MIS transistor of a second conductivity type formed on said semiconductor substrate, wherein there is a difference in shape of a structural member, distinguishable by appearances, between said first and second MIS transistors, and wherein said structural member includes a field oxide film.

17. The gate array according to claim 16, wherein said structural member further includes a field shield electrode.

18. The gate array according to claim 17, wherein there is a difference in a shape of a hole for body contact provided in said field shield electrode, between said plurality of first and second MIS transistors.

19. A gate array comprising:

a plurality of first rows formed by arranging a plurality of first MIS transistors on a semiconductor substrate; and a plurality of second rows formed by arranging a plurality of second MIS transistors on said semiconductor substrate, wherein there is a difference in shape of a structural member, distinguishable by appearances, between said first and second rows, and a contact pad portion of a gate electrode is provided with only one contact.

20. A gate array comprising:

a plurality of first MIS transistors of a first conductivity type formed on a semiconductor substrate; and a plurality of second MIS transistors of a second conductivity type formed on said semiconductor substrate, wherein there is a difference in shape of a structural member, distinguishable by appearances, between said first and second MIS transistors, and a contact pad portion of a gate electrode is provided with only one contact.

* * * * *